(12) United States Patent
Lai

(10) Patent No.: US 6,526,112 B1
(45) Date of Patent: Feb. 25, 2003

(54) SYSTEM FOR CLOCK AND DATA RECOVERY FOR MULTI-CHANNEL PARALLEL DATA STREAMS

(75) Inventor: Benny W. H. Lai, Fremont, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/342,297

(22) Filed: Jun. 29, 1999

(51) Int. Cl.$^7$ ............................................... H03D 23/00
(52) U.S. Cl. ........................................ 375/376; 375/375
(58) Field of Search ................................ 375/373–376; 331/17, 57

(56) References Cited

U.S. PATENT DOCUMENTS 5,012,494 A * 4/1991 Lai et al. .................... 331/1 A
5,872,488 A * 2/1999 Lai ............................ 331/175
6,307,906 B1 * 10/2001 Tanji et al. ................. 375/375

* cited by examiner

*Primary Examiner*—Stephen Chin
*Assistant Examiner*—Lawrence Williams

(57) ABSTRACT

The present invention provides independent CDR (clock and data recovery) functions on N number of high speed parallel channels, yet only requiring one capacitor. This enables multiple independent CDR channels to be integrated onto one IC with a minimum overhead component of one capacitor. In one embodiment, the present invention provides a multiple channel clock and data recovery system which includes N phase lock loop circuits for receiving in parallel N data channels, each of the N phase lock loop circuits including a digital phase detector and a dual-input VCO in which one VCO input is an analog input for setting the center frequency of the VCO and the other VCO input is a digital input from the respective phase detector for toggling the center frequency and wherein each phase detector compares the phase of the respective incoming data channel with that of the respective VCO output. The system further includes a first phase lock loop circuit of the N phase lock loop circuits further including an integrator having a single capacitor, the integrator connected between the output of the first phase detector and the analog input of the respective first VCO wherein the output of the first phase detector is input to the integrator, the output of the integrator is also input to the remaining analog inputs of the other VCOs such that the remaining phase lock loop circuits are slaved to the first phase lock loop circuit.

4 Claims, 7 Drawing Sheets

SYSTEM FOR CLOCK AND DATA RECOVERY FOR MULTI-CHANNEL PARALLEL DATA STREAMS

BACKGROUND OF THE INVENTION

In modem digital communications systems, the function of clock and data recovery (CDR) is essential before the data can be decoded or repeated. In many systems, data in the range of 100's of megabits/sec, are time-multiplexed to form a single channel high speed data stream above a gigabit/sec. Conduits containing multiple channels of these high speed streams, such as parallel optical links, and low loss ribbon cables, have emerged. Thus, at the parallel data receiver, there is a need to provide a CDR system for multiple channels. Furthermore, there is a need to implement this CDR system on a single IC for minimal costs.

For systems where the serial channels were derived from the same clock, it is possible to use a single channel to recover the clock and retime the parallel data streams. Here, only one channel is fed into a clock extraction circuit, and the recovered clock is used to retimed the bank of parallel decision circuits (D type flip/flops) 18 as shown in FIG. 1. The transmitter 10 in FIG. 1 sends N parallel streams synchronous to a common clock 14. The receiver 12 uses a recovered clock 16 extracted from a single one of the N channels to retime all N channels.

However, since the propagation through each channel has tolerance, the phase of each channel must be separately adjusted for the common clock to be used to retime the data, as the sample point of each data stream is not at its optimum. This is especially true as the distance of the conduit is increased and the tolerance gets worse. Also, each channel propagation may vary due to physical bending, etc, which requires each channel's timing to be dynamically changed.

For systems where the serial channels were derived from different clocks of the same frequency (ie different crystals of the same frequency), then each channel must have its own CDR, as shown in FIG. 2. This is the case of a data switch or repeater. Each flip-flop 28 has a dedicated clock 24. For the model shown in FIG. 2, there is a dedicated CDR circuit 26 for each of the N channels to insure that the input data stream is always sampled at its optimum point, regardless of the relative phase relationships of the various channels.

SUMMARY OF THE INVENTION

It is an object of the present invention to provide an improved multiple channel and data recovery system.

The present invention provides independent CDR (clock and data recovery) functions on N number of high speed parallel channels, yet only requiring one capacitor. This enables multiple independent CDR channels to be integrated onto one IC with a minimum overhead component of one capacitor.

In one embodiment, the present invention provides a multiple channel clock and data recovery system which includes N phase lock loop circuits for receiving in parallel N data channels, each of the N phase lock loop circuits including a digital phase detector and a dual-input VCO in which one VCO input is an analog input for setting the center frequency of the VCO and the other VCO input is a digital input from the respective phase detector for toggling the center frequency and wherein each phase detector compares the phase of the respective incoming data channel with that of the respective VCO output.

The system further includes a first phase lock loop circuit of the N phase lock loop circuits further including an integrator having a single capacitor, the integrator connected between the output of the first phase detector and the analog input of the respective first VCO wherein the output of the first phase detector is input to the integrator, the output of the integrator is also input to the remaining analog inputs of the other VCOs such that the remaining phase lock loop circuits are slaved to the first phase lock loop circuit.

Other objects, features and advantages of the present invention will become apparent from the following detailed description when taken in conjunction with the accompanying drawings.

BRIEF DESCRIPTION OF THE DRAWINGS

The accompanying drawings where like numerals indicate like components and which are incorporated in and form a part of this specification, illustrate embodiments of the invention and, together with the description, serve to explain the principles of the invention.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

Figure 1:
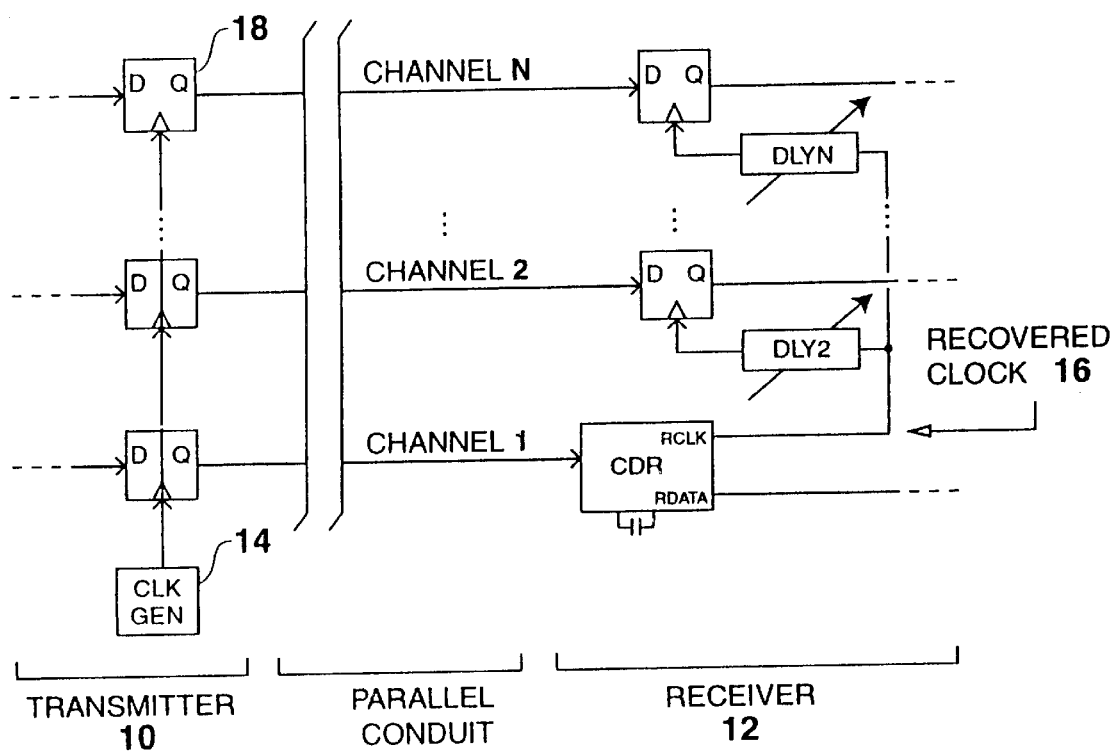
FIGS. 1 and 2 show examples of prior art approaches.
Figure 2:
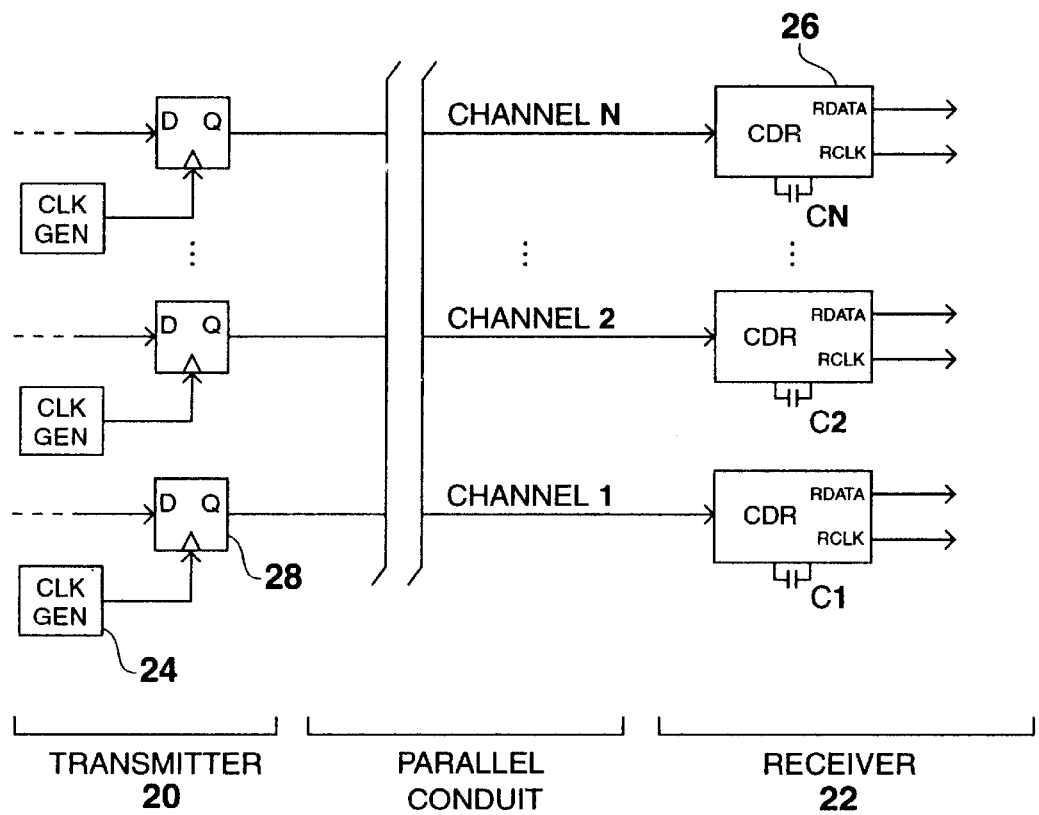
Figure 3:
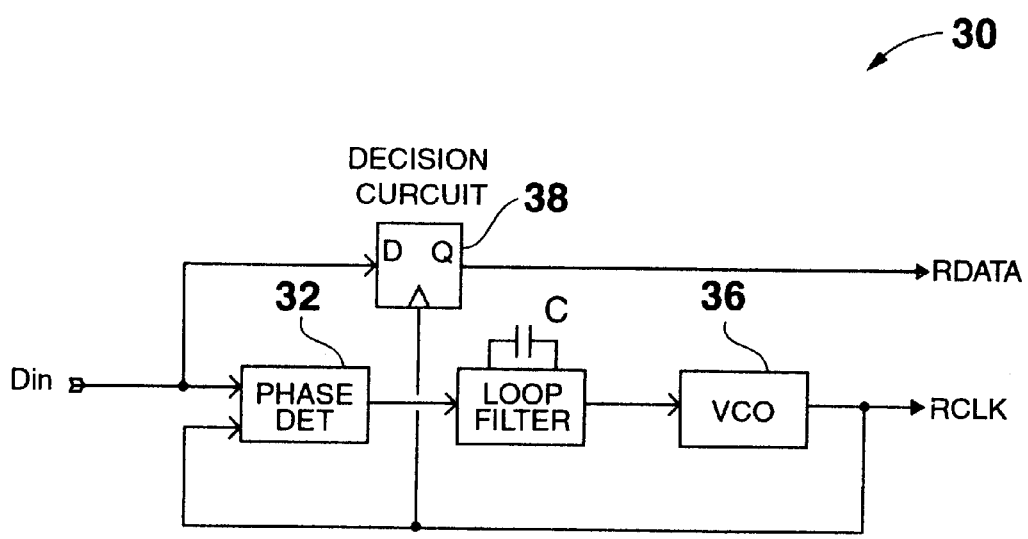
FIG. 3 shows a prior art clock and data recovery (CDR) circuit.

The present approach for parallel CDR's is exactly that, n numbers of independent CDRs. Typically, a CDR 30 as shown in FIG. 3 comprises of a Phase-Lock-Loop (PLL), to recover the clock, and a decision circuit to retime the input data. A typical PLL comprises of a phase detector 32, a loop-filter 34, and a voltage-controlled oscillator (VCO) 36, as shown in FIG. 3. The CDR 30 uses a Phase Lock Loop to recover clock, and the decision circuit 38 to retime data. The loop filter 34 usually includes capacitor C, which can be implemented on or off chip.

The phase detector 32 and the VCO 36 require very little active area to integrate. The capacitor, Cp, however, takes much active area, and often is more economically to use an external capacitor to the IC.

For n channels of CDR's, n numbers of loop filters requiring n numbers of capacitors are needed. This makes the usage much harder to implement. For example, a system containing 16 parallel high-speed serial streams need 16 loop filters. While the 16 phase detectors and VCO can be implemented on one IC, the 16 required capacitors makes the function more difficult to implement either on or off the chip. The problem grows quickly as n gets bigger.

Principle of Operation

The goal of this invention is to provide independent CDR functions on n number of high speed parallel channels, yet only requiring one capacitor. This enable multiple independent CDR channels to be integrated onto one IC with a minimum overhead component of one capacitor.

Figure 4:
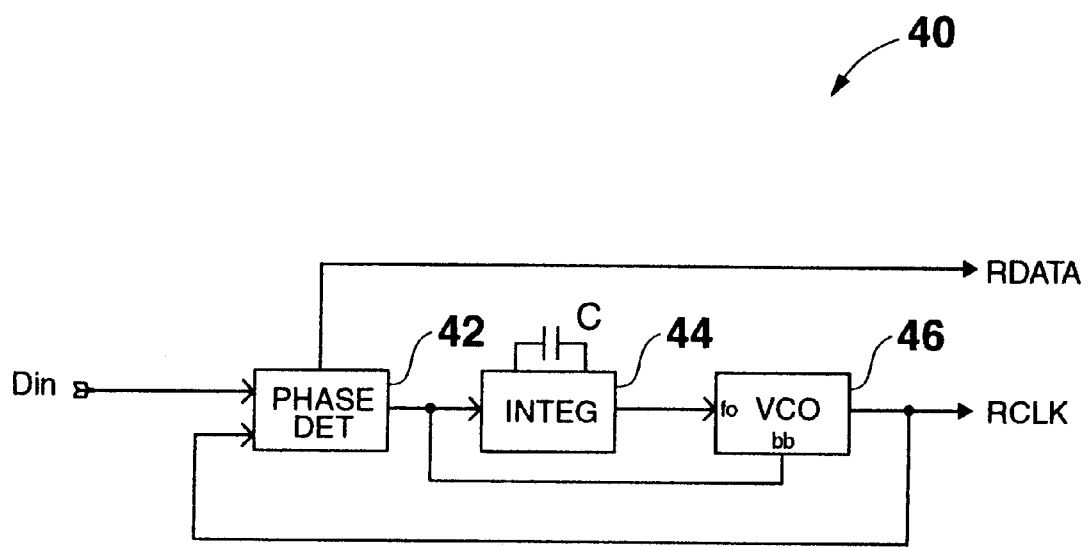
FIG. 4 shows a phase detector according to the present invention.

To do this, a bang/bang PLL architecture 40 as described by Lai-Walker [1,2] is used, as shown in FIG. 4, in which the phase detector 42 includes data retiming and the loop filter of FIG. 3 is replaced by an integrator 44 which integrates the output of the phase detector 42 over time using a single capacitor C and the traditional VCOs replaced by dual-input VCO 46. This architecture uses the dual-input VCO 46, in which one input is an analog voltage which sets the center frequency of the VCO (labeled fo), and another is a digital input, (labeled bb for bang/bang), which toggles the center frequency a minute amount. The loop filter is implemented by the integrator 44, which requires one capacitor C.

In one implementation, the capacitor C is external to the IC. The phase detector 42 is digital, which compares the phase of the incoming random data to that of the VCO clock output. The output of the detector 42 is fed into the integrator 44 and the VCO's 46 bang/bang input. As shown in FIG. 4, the output of VCO 46 is RCLK which is also fed back as an input to phase detector 42. The phase detector 42 also performs the data retiming function for forming the RDATA signal, as also shown in FIG. 4.

Figure 5:
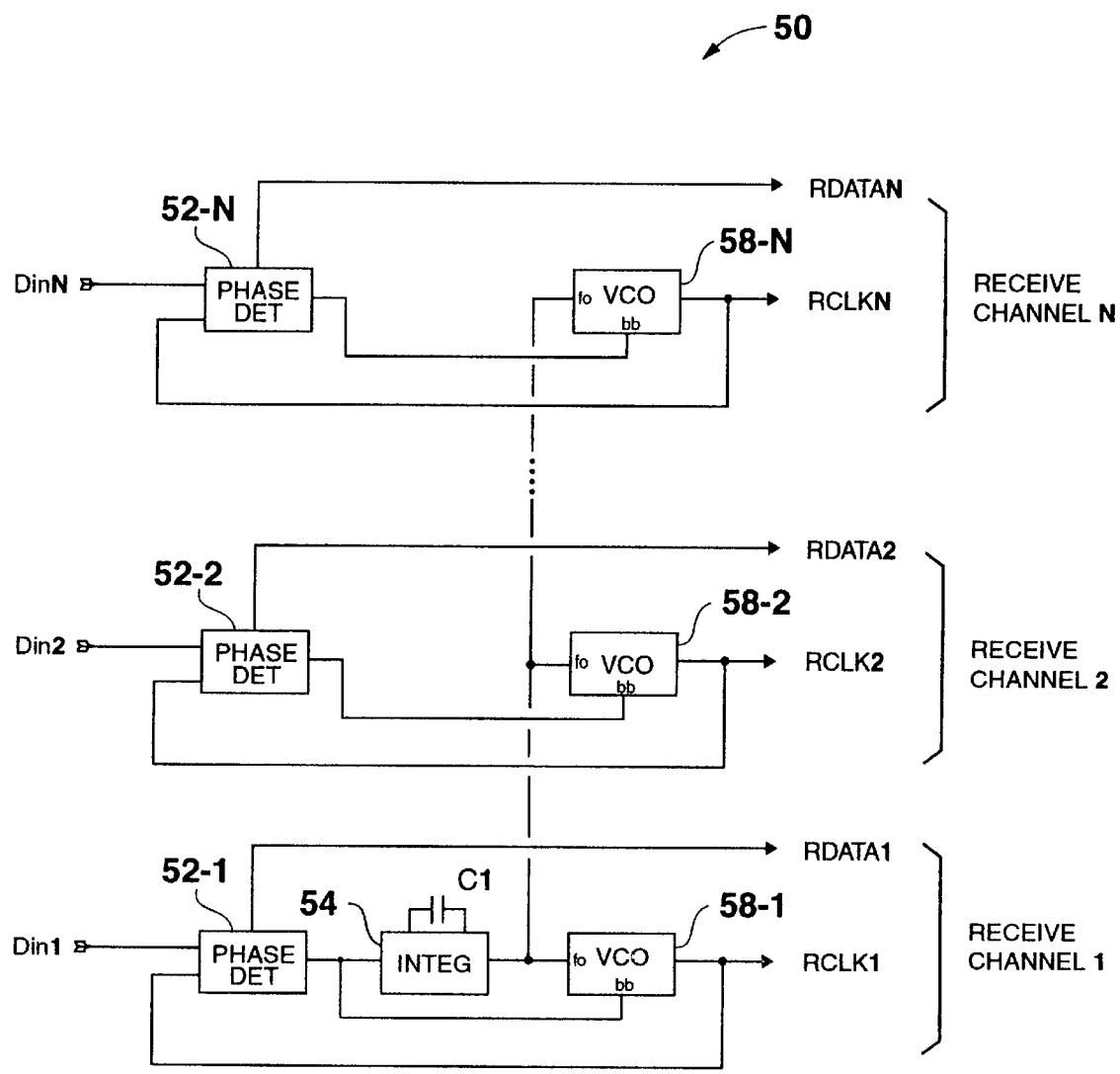
FIG. 5 one embodiment of a multiple channel CDR according to the present invention.

One embodiment of the present invention is shown in FIG. 5, in which multiple CDRs are slaved to the PLL of receive channel 1, requiring only one capacitor. In FIG. 5, a bang/bang PLL mentioned above is used on the first channel (Channel 1) to perform the function of CDR. Channel 1 includes the phase detector 52, integrator 54 with single capacitor C1, and dual-input VCO 58. All other channels use a reduced architecture comprising just the phase detector 52 and VCO 58. The serial data is fed into the input of the phase detector 52. The output of the phase detector 52 of channel 1 is fed into the bang/bang input of the VCO 58, the output of which is connected back to the phase detector 52. Again, the phase detector 52 also performs the retiming function, and provides a retimed data as the output. The analog voltage derived from channel 1 (with full CDR architecture) is fed into the analog voltage inputs of each of the "slaved" VCO's 58 analog voltage inputs, as shown in FIG. 5. The RDATA1, RDATA2, . . . , RDATAN, and RCLK1, RCLK2, . . . , RCLKN signals are analogous to the RDATA AND RCLK signals shown in FIG. 4.

Figure 6:
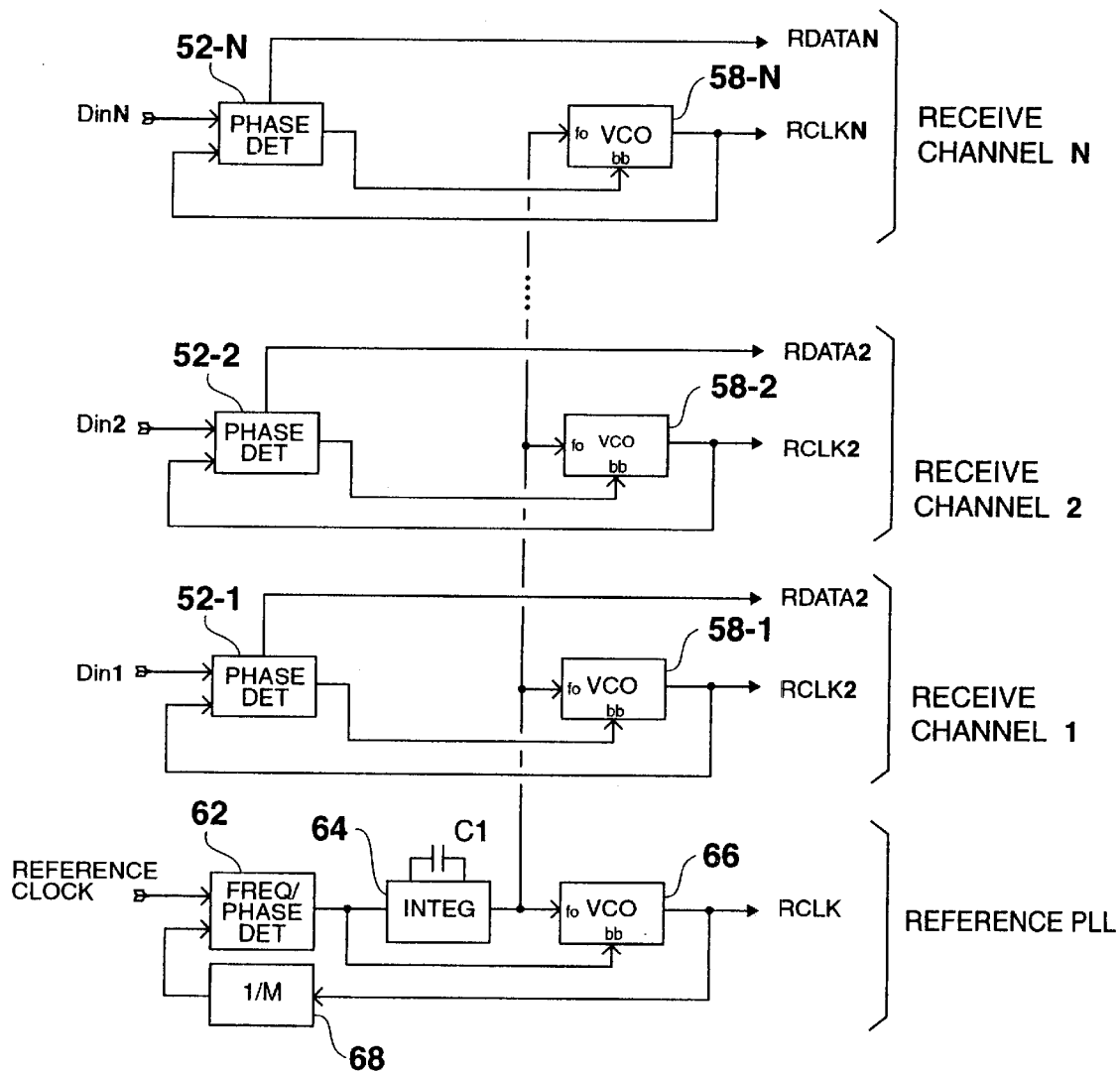
FIG. 6 shows another embodiment of a multiple channel CDR according to the present invention.

A second embodiment 60 of this invention is shown in FIG. 6. Here a bang/bang PLL comprising a frequency/phase detector 62, integrator 64 and VCO 66, is used to lock onto a reference clock. An optional (1/m) divider 68 is inserted between the VCO 66 output and the phase detector 62 input to allow the frequency of the reference clock to be (1/m) that of the bit rate.

In this configuration, the phase detector for random data is replaced with a simple sequential frequency/phase detector 62, since the reference clock is always repetitive. The RDATA1, RDATA2, . . . , RDATAN, and RCLK1, RCLK2, . . . , RCLKN signals are analogous to the RDATA AND RCLK signals shown in FIG. 4.

Each of the parallel channels uses a reduced architecture comprising of the same phase detector 52 and VCO 58 connection as described above. Here, the output of the integrator 64 in the reference clock's PLL is fed into the analog inputs of the parallel VCO's 58.

Figure 7:
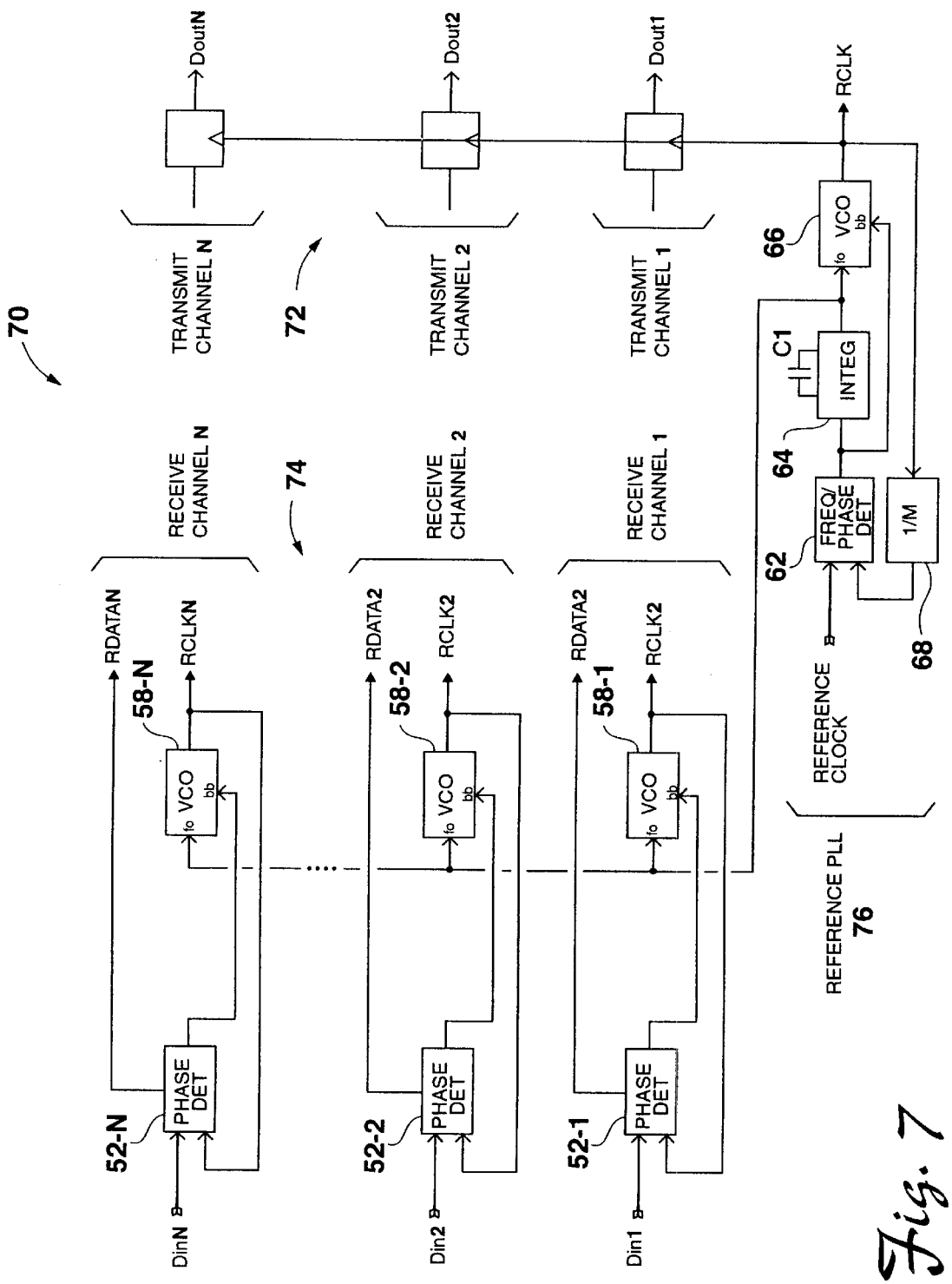
FIG. 7 shows still another embodiment of a multiple channel CDR according to the present invention.

A third embodiment of this invention is shown in FIG. 7. In FIG. 7, a system 70 is shown where both the transmitter 72 and receiver 74 are integrated together onto a single chip. The transmitter PLL 76 locks onto a reference clock and multiplies it up to the high speed bit rate. The receiver PLL again uses the reduced bang/bang PLL's, with their VCO's 58 matched to that of the transmitter PLL 76. The voltage of the integrator 64 from the PLL 76 of the Transmitter is fed into the center frequency control voltage input of the VCO's 58 of the receivers. Again, the RDATA1, RDATA2, . . . , RDATAN, and RCLK1, RCLK2, . . . , RCLKN signals are analogous to the RDATA AND RCLK signals shown in FIGS. 4, 5 and 6. The transmitter 72 generates the DOUT1, DOUT2, . . . , DOUTN signals.

In this embodiment, advantage is taken of the existing PLL on the clock multiplication of the transmitter 72, and slaving all of the VCO's 58 of the receiver 74 to the transmitter VCO. This enable the system to have n-channels of transmit and receive channels with only one large value capacitor C1.

For these systems to work properly, the bang/bang time of the slaved VCO 58 must be designed to produce a bang/bang frequency which is larger than the mismatches of the VCO's, plus the tolerance of the bit rate at each channel. Typically VCO's implemented on the same IC have small mismatches of less than 0.1%. Also, bit rates have tolerance in the 100's of ppm's. Thus, a bang/bang frequency of only around a few percent or less is adequate.

Advantages Over Previous Designs

This architecture enables independent n channel parallel CDR functions with a constant overhead of only a single capacitor. Previously, the required capacitors grows linearly with each independent channel, making larger parallel high-speed system impractical. This invention will make high-speed channels with 16, 32, or more channels practical with much lower costs.

With independent CDR functions on each channel, each data is retimed at its own data eye center, thus maximizing the sensitivity of each channel. Since each channel has its own CDR, the channels can be asynchronous, with no restrictions on their relative phases.

In the second and third embodiments, the voltage controlling the center frequency of the slaved VCO's are derived from a reference clock, and are independent of all channels. This makes the PLL's of the receiver first order, with the jitter defined only by the bang/bang time. The advantage of this is that the parallel CDR can be used as a repeater, and the jitter accumulation over many of these repeaters is linear.

In systems where the PLL is second order, jitter will accumulate exponentially as the number of repeater is increased. Typically, the loop is damped with a large value of capacitor in the loop filter to insure that the exponential jitter accumulation occurs at a large number of repeater. In effect, the large capacitor tries to maintain the VCO control voltage constant, thus approaching the performance of a first order loop.

An IC implementing embodiment three was successfully fabricated. Here, n=1, and the receiver VCO uses the reduced bang/bang loop as the CDR, and is slaved to the transmitter VCO. The center frequency is selectable between 1.0625 GB/sec (Fibre Channel) and 1.25 GB/sec (Gigabit Ethernet).

The bang/bang time of the VCO is 16 pS, or ~2% of the bit period. The CDR using the reduced bang/bang loop architecture is fully function.

The foregoing descriptions of specific embodiments of the present invention have been presented for purposes of illustration and description. They are not intended to be exhaustive or to limit the invention to the precise forms disclosed, and it should be understood that many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

REFERENCES

[1] "A Monolithic 622 Mb/s Clock Extraction Data Retiming Circuit", Benny Lai and Richard Walker, 1991 ISSCC Proceedings, TPM 8.7, pp 144–145.

[2] "Method and Apparatus For Clock Recovery And Data Retiming of Random NRZ Data", Benny Lai and Richard Walker, U.S. Pat. No. 5,012,494, Granted Apr. 30, 1991.

What is claimed is:

1. A multiple channel clock and data recovery system comprising:
   N phase lock loop circuits for receiving in parallel N data channels, each of the N phase lock loop circuits including a digital phase detector and a dual-input VCO in which one VCO input is an analog input for setting the center frequency of the VCO and the other VCO input is a digital input from the respective phase detector for toggling the center frequency and wherein each phase detector compares the phase of the respective incoming data channel with that of the respective VCO output;
   a first phase lock loop circuit of the N phase lock loop circuits further including an integrator having a single capacitor, the integrator connected between the output of the first phase detector and the analog input of the respective first VCO wherein the output of the first phase detector is input to the integrator, the output of the integrator is also input to the remaining analog inputs of the other VCOs such that the remaining phase lock loop circuits are slaved to the first phase lock loop circuit.

2. A multiple channel clock and data recovery system comprising:
   N phase lock loop circuits for receiving in parallel N data channels, each of the N phase lock loop circuits including a digital phase detector and a dual-input VCO in which one VCO input is an analog input for setting the center frequency of the VCO and the other VCO input is a digital input from the respective phase detector for toggling the center frequency and wherein each phase detector compares the phase of the respective incoming data channel with that of the respective VCO output;
   a reference phase lock loop circuit, the reference phase lock loop circuit including a frequency/phase detector for detecting the phase of a repetitive reference clock, a dual-input reference VCO and an integrator having a single capacitor, the integrator connected between the output of the reference phase detector and the analog input of the reference VCO wherein the output of the reference phase detector is input to the integrator, the output of the integrator is also input to the remaining analog inputs of the N VCOs such that the remaining phase lock loop circuits are slaved to the reference phase lock loop circuit.

3. A system as in claim 2 including a divider circuit connected between the reference VCO output and the reference phase detector for dividing the frequency of the reference clock.

4. A multiple channel clock and data recovery system comprising:
   N phase lock loop receiver circuits for receiving in parallel N data channels, each of the N phase lock loop circuits including a digital phase detector and a dual-input VCO in which one VCO input is an analog input for setting the center frequency of the VCO and the other VCO input is a digital input from the respective phase detector for toggling the center frequency and wherein each phase detector compares the phase of the respective incoming data channel with that of the respective VCO output;
   a reference phase lock loop circuit, the reference phase lock loop circuit including a frequency/phase detector for detecting the phase of a repetitive reference clock, a dual-input reference VCO and an integrator having a single capacitor, the integrator connected between the output of the reference phase detector and the analog input of the reference VCO wherein the output of the reference phase detector is input to the integrator, the output of the integrator is also input to the remaining analog inputs of the N VCOs such that the remaining phase lock loop circuits are slaved to the reference phase lock loop circuit, and
   N transmitter phase lock loop circuits slaved to the reference phase lock loop circuit.

* * * * *